United States Patent [19]

Young

[11] Patent Number: 4,583,288

[45] Date of Patent: Apr. 22, 1986

[54] APPARATUS FOR THE ACQUISTION AND INSERTION OF DUAL IN-LINE PACKAGE COMPONENTS

[75] Inventor: Steven J. Young, Pittsburgh, Pa.

[73] Assignee: Westinghouse Electric Corp., Pittsburgh, Pa.

[21] Appl. No.: 750,649

[22] Filed: Jun. 28, 1985

Related U.S. Application Data

[63] Continuation of Ser. No. 513,135, Jul. 12, 1983, abandoned.

[51] Int. Cl.⁴ ............................................. H05K 13/04
[52] U.S. Cl. ........................................ 29/741; 29/252; 29/260; 29/261
[58] Field of Search ................. 29/741, 758, 764, 252, 29/260, 261, 278, 244

[56] References Cited

U.S. PATENT DOCUMENTS 4,283,826  8/1981  Miller .................................... 29/252

FOREIGN PATENT DOCUMENTS 2745966  4/1979  Fed. Rep. of Germany ........ 29/764
2817481  7/1979  Fed. Rep. of Germany ........ 29/764

Primary Examiner—Howard N. Goldberg
Assistant Examiner—Timothy V. Eley
Attorney, Agent, or Firm—Thomas R. Trempus

[57] ABSTRACT

An end effector for an industrial manipulator acquires, loads and inserts a dual in-line package device into a printed circuit board, DIP socket or the like. The end effector includes a gripper body which defines a chamber portion therein and a pair of multi-fingered gripper means operably associated with the body portion for reciprocal movement between a first, fully extended device acquisition position and a second, fully retracted position within the body portion chamber. The body portion also includes retaining means for removably retaining a DIP device in said chamber after the disengagement of the gripper means.

Pneumatic cylinders are provided to effect the aforementioned reciprocal movement and to urge the DIP device from the retaining means and insert the device into a circuit board or the like. The retaining means both hold the DIP device during the loaded state and align the DIP connector pins for insertion into the circuit board or the like.

22 Claims, 6 Drawing Figures

APPARATUS FOR THE ACQUISTION AND INSERTION OF DUAL IN-LINE PACKAGE COMPONENTS

This application is a continuation of application Ser. No. 513,135, filed July 12, 1983, now abandoned.

BACKGROUND OF THE INVENTION

The invention relates generally to end-effectors utilized in the automated installation of electronic components in printed circuit boards. More particularly, the invention provides an end-effector for the acquisition and insertion of dual in-line package components into printed circuit boards or dual in-line package sockets.

A dual in-line package is a type of housing for integrated circuits. Typicaly, the dual in-line package, or DIP, is a molded plastic container about ¾" long and ⅜" wide. Heretofore, for example, it has been known to install the DIP device according to one of the techniques described below. U.S. Pat. No. 4,283,836 discloses an apparatus for sequentially inserting a number of DIP components which are loaded into the apparatus. In U.S. Pat. No. 3,727,284, an electrical component insertion apparatus manipulates the component's leads prior to insertion into the circuit board. The circuit board is mounted on a panagraphic mechanism which cooperates with the gripper to align and insert components. Finally U.S. Pat. No. 3,780,415 shows a DIP inserter with a rotatable, grooved lead aligner which swings up out of the way for component insertion. All of these component manipulators are somewhat bulky and thus limit the component configuration of the board being constructed. As a result, fewer components can be inserted into a given circuit board area.

It is an object of this invention to provide an apparatus which minimizes the surface area of a circuit board which must be dedicated to the spare requirements of an end effector.

It is a further object of this invention to provide an end effector which acquires, loads and transports a DIP to a component location while automatically aligning the DIP connector pins for insertion.

SUMMARY OF THE INVENTION

An end effector for acquiring, loading and inserting a dual in-line package into a circuit board or a DIP socket includes a gripper body with a chamber therein adapted to receive a DIP device thereinto. A pair of multi-fingered gripper means are operably associated with the body portion for reciprocal movement from a first fully extended, device acquisition position and a second fully retracted position within the chamber, thus loading the device into a retaining means which both holds the DIP device within the chamber and aligns the DIP's component pins. Pneumatic cylinders are operably associated with both the finger gripper means to effect the reciprocal movement of the finger means and pneumatic cylinders are provided to eject the loaded DIP device from the chamber's retaining means.

BRIEF DESCRIPTION OF THE DRAWINGS

The above as well as other features and advantages of this invention will become apparent through consideration of the detailed description in connection with the accompanying drawings in which.

DETAILED DESCRIPTION OF THE INVENTION

Figure 1:
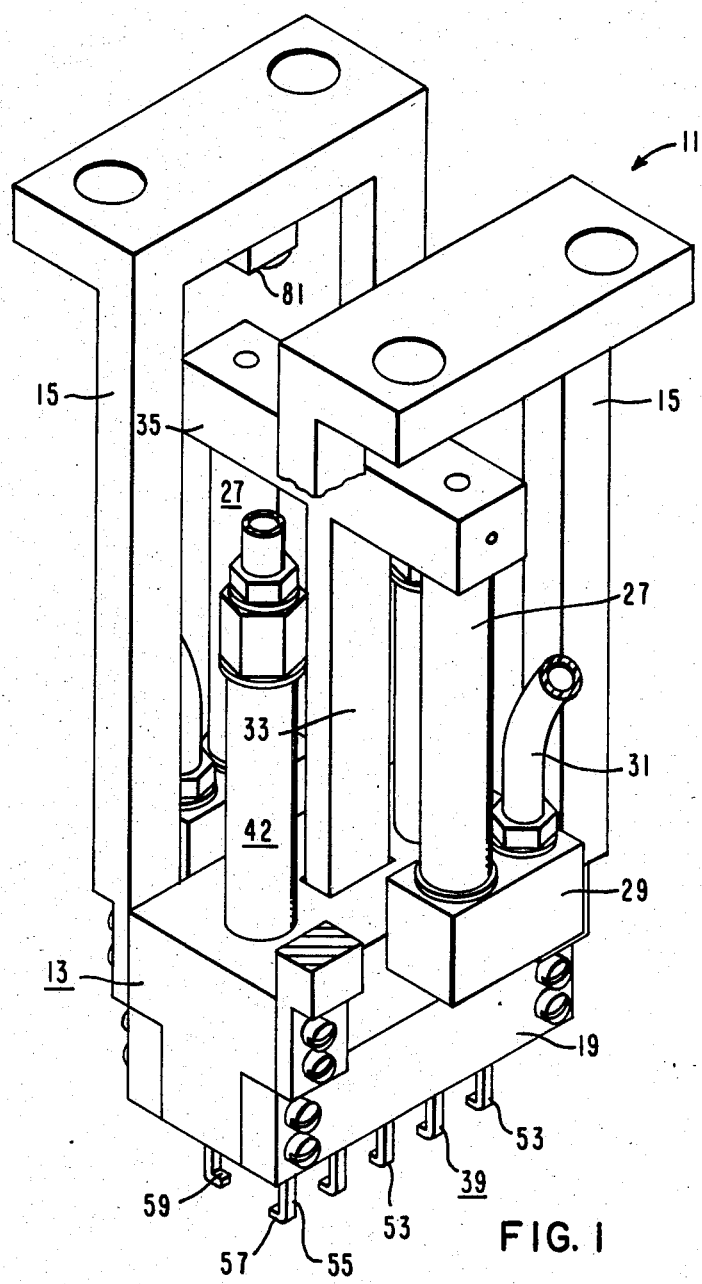
FIG. 1 is a isometric view of an end effector with section cut away, for the acquisition, transport and insertion of a dual in-line package device.
Figure 2:
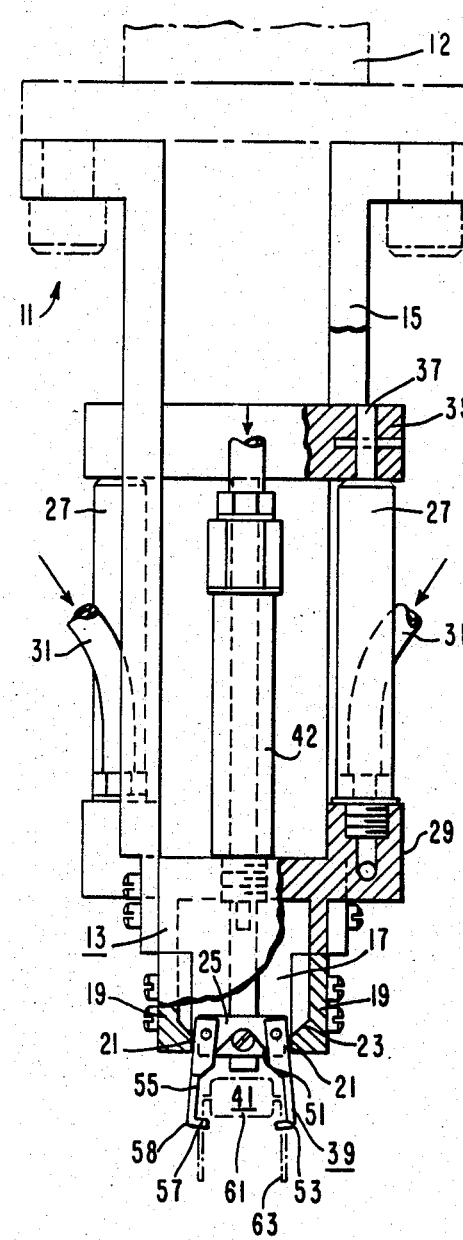
FIG. 2 is a cross-sectonal, side elevation view of the apparatus according to this invention.
Figure 3:
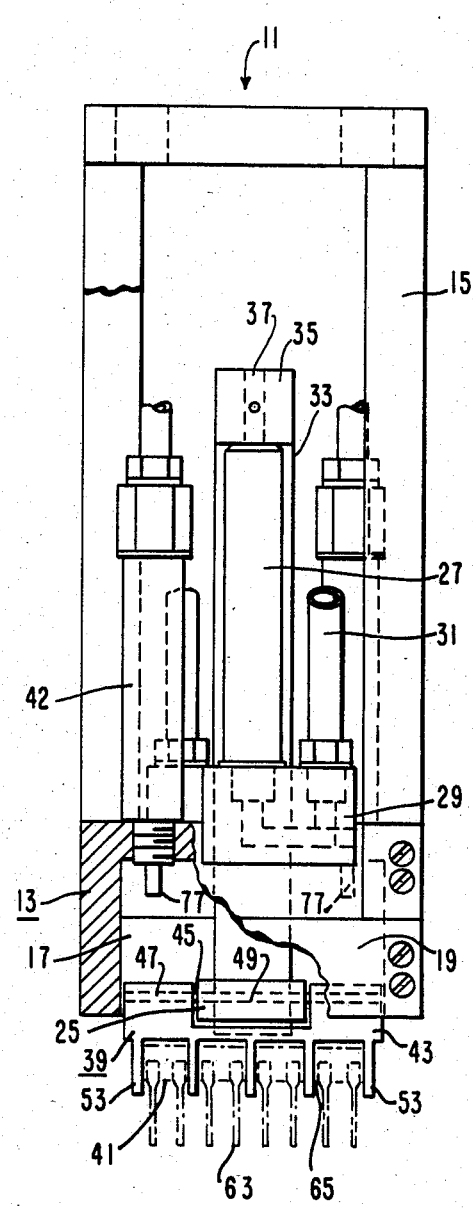
FIG. 3 is a cross-sectional, front elevation view of the apparatus according to this invention.

Considering FIGS. 1 through 3, the end effector according to this invention is generally indicated by the reference character 11. This end effector 11 can be mounted on the arm of an industrial manipulator (shown in dash dot at 12) directly or in combination with a compliant device. These mounting techniques are known to those skilled in the art and therefore not illustrated herein in detail.

The present end effector or DIP gripper 11 includes a body portion 13 which has a framework as at 15 by which the gripper is removably mounted onto an industrial manipulator and a chamber 17 in the lower portion thereof. The side wall sections 19 of the body 13 include a combination dual in-lline package device lead positioning and retaining surface 21 and a cam-like recessed region 23. The cam-like recessed region 23 provides a greater cross-sectional dimension than the cross-sectional dimension between the opposed positioning and retaining surfaces 21 of the side wall sections 19. A carriage structure 25 is suspended within the body chamber 17 by means of at least one, and preferably two vertically positioned pneumatic cylinders 27, for reciprocal vertical movement within the chamber 17. Each cylinder 27 is mounted in a cylinder support member 29 which is in communication with a pressurized and controllable source of air (not shown) through lines 31. The carriage 25 includes a rod 33 atop of which is a cross member 35. The pistons 37 of each cylinder 29 are operably associated with the cross member 35 to effect the aforedescribed reciprocal movement. A pair of multi-fingered gripping means 39 are operably associated with the carriage structure 25. These gripping means 39 engage and lift a dual in-line package device 41 into the chamer 17 as will be described hereinafter in detail. At least one, and preferably two DIP device 41 ejection means 42 are also mounted in the gripper 11.

The multi-fingered gripping means 39 has an upper mounting section 43 adapted to be received by the carriage structure 25 in a pivoting or hinge-like relationship by means of a pin 45 inserted into a bore 47 in the upper mounting section 43 and through a bore 49 in the carriage structure. A biasing means 51 is operably associated with each of the multi-fingered gripping means 39. The biasing means 51 is shown as a resilient wire member mounted onto the carriage structure 25 and positively urging the gripping means 39 out away from the carriage structure 25 into an "open" position. The gripping means 39 also includes a plurality of fingers 53 depending downwardly from the upper mounting section 43. Each finger 53 comprises an elongated portion 55 which terminates in an inwardly curving tooth-like member 57 with a bearing surface 59. There is a curved outer portion 58 having a radius selected to enhance the cooperation of the fingers 53 with the cam-like surface 23 during gripper manipulation. The number and dimensions of the fingers 53 provided on each gripping means 39 are selected in order to effectively cooperate with a dual in-line package device (DIP) 41. The DIP 41 basically includes a body portion 61 which is a generally rectangular housing containing integrated circuits. The standard form is a molded plastic container about $\frac{3}{4}$ inch long and $\frac{1}{3}$ inch wide, with two rows of pins 63 spaced 0.1 inch between centers as at 65 depending therefrom. A single row of pins 63 may consist of seven or eight individual pin contacts. The illustrated embodiment of this invention is equally well suited for either a fourteen or sixteen pin DIP devices, even though for the sake of simplicity, only a sixteen pin DIP device 41 is illustrated. In the typical, commercially available DIP device, the contact pins 63 are not completely positioned for immediate insertion into a DIP socket or the like. Generally, the leads are positioned outwardly about 5° from the normal, and the two rows of pins must be slightly compressed toward each other so that pin alignment with the socket or receptical is achieved. The apparatus of this invention is so configured that the DIP device pins are automatically repositioned for alignment with and insertion into the DIP socket. The multi-fingered gripper means 39 can be manufactured from die hardenable steel which resists curling upon tempering. The fingers 53 are of such a size that they fit between the pins 63 of the DIP device 41 as at 65. The preferred embodiment has a total of five fingers 53 depending from each multi-finger gripper means 39. However, the number of fingers utilized in manipulating a DIP device may vary and the number of fingers provided during the manufacture of the gripper can also deviate. Obviously, at least two fingers 53 must be provided on each multi-fingered gripping means 39, and they must be positioned relative to each other such that each finger can slip between a pair of adjacent DIP body pin leads as at 65.

Figure 5:
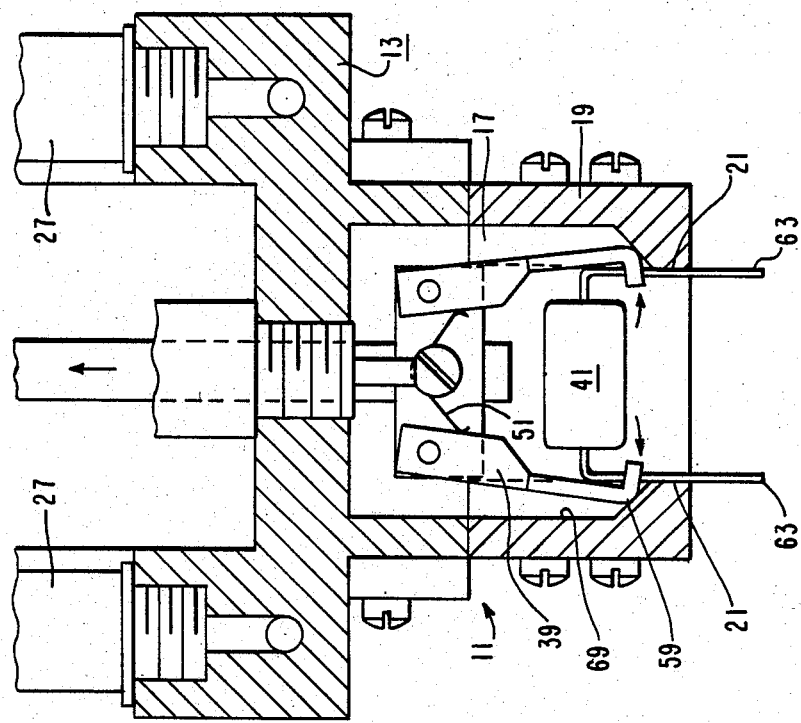
FIG. 5 is a partial, cross sectional, side elevation of the gripper of this invention with the dual in-line package device in the "loaded" state.
Figure 4:
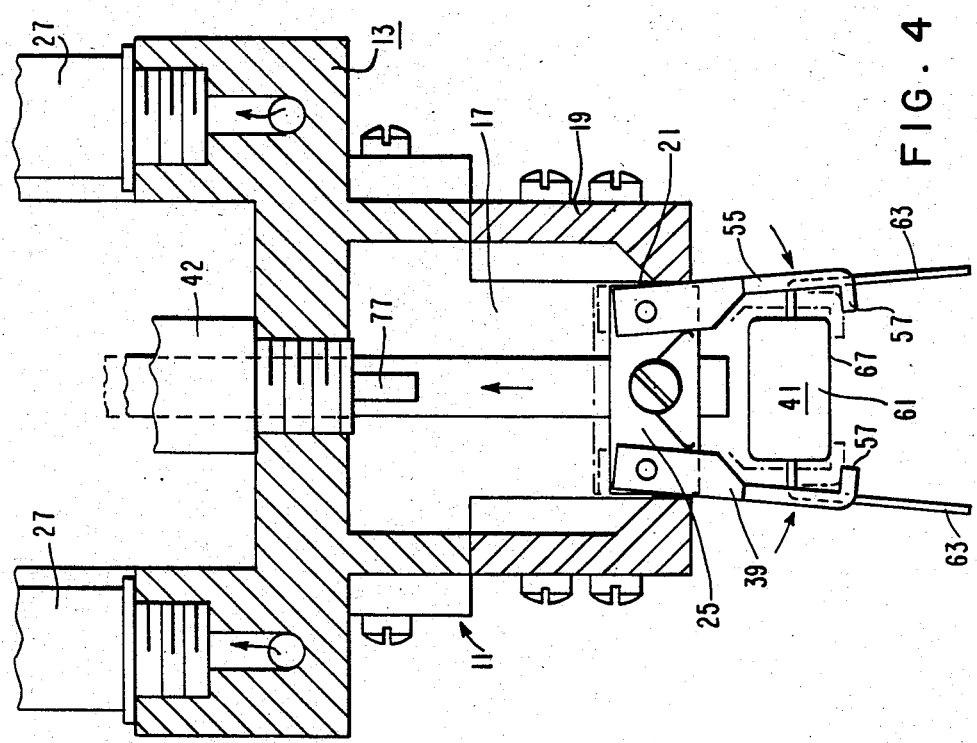
FIG. 4 is a partial, cross sectional, side elevation of the gripper of this invention as it engages the dual in-line package device.
Figure 6:
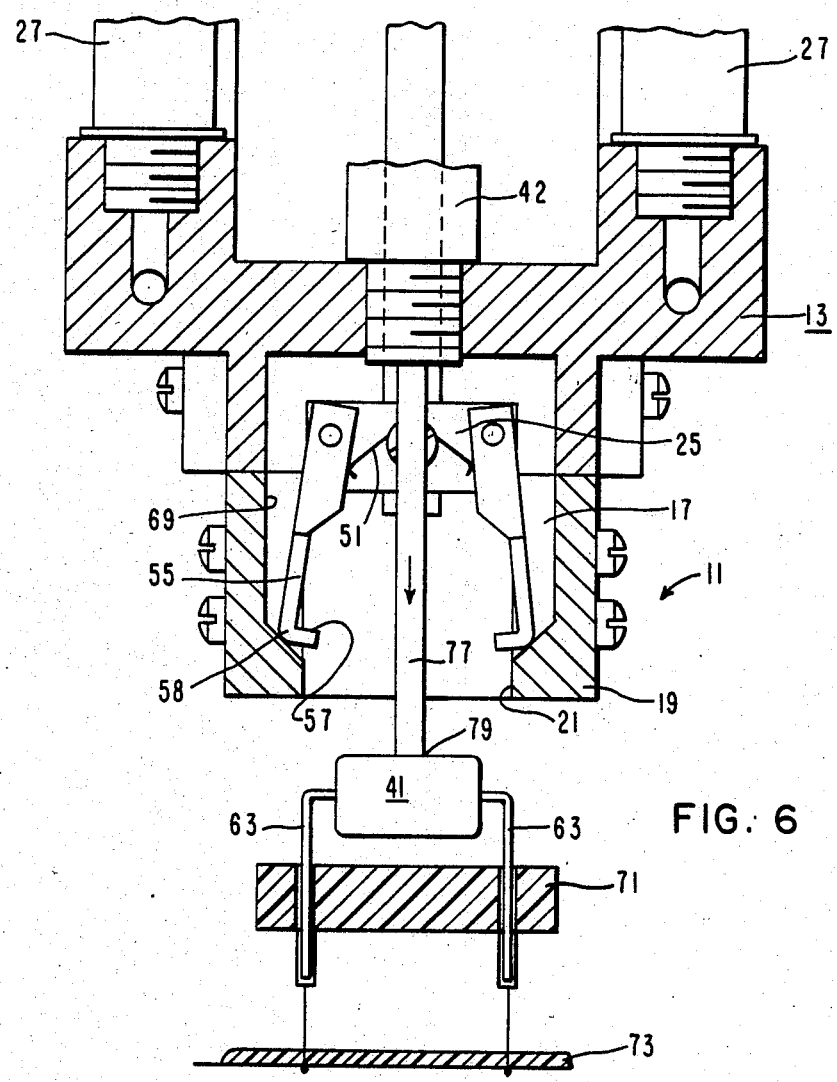
FIG. 6 is a partial, cross sectional, side elevation of the gripper of this invention in the "insertion" state as a dual in-line package device is inserted into a printed circuit board or I.C. socket.

The unique functional relationship of the various components of the gripper 11 will be more fully appreciated through consideration of FIGS. 4 through 6 which illustrate the operation of the DIP gripper 11. In FIG. 4, the gripper 11 is shown in a "ready state" in which the carriage structure 25 is in its extended position, unsheathing the multi-finger gripper means 39 from the body chamber 17. The unsheathed multi-finger gripper means 39 are urged into a spaced-apart or open relationship by the action of the biasing means 51. The gripper 11 is lowered down over the DIP device 41 so that the unsheathed multi-finger gripper means 39 straddle the DIP device 41.

Shown in phantom in FIG. 4, the DIP gripper 11 has actually engaged the DIP device 41 and is drawing the DIP device 41 into the body chamber 17. In order to engage the DIP device 41 with the multi-fingered gripper means 39, the carriage structure 25 is partially retracted into the body chamber 17 by the previously described pneumatic cylinders 27. As the carriage structure is retracted, the unsheathed and opened multi-fingered gripper means 39 are urged toward each other as they are drawn past the opposed surfaces 21 of the side walls of the chamber 17. The sheathing and closing action causes the tooth 57 of each finger 53 which is positioned between a pair of adjacent DIP pins to pass between the pins as at 65 and engage the underside 67 of the DIP body 61. The retraction of the carriage structure 25 thus causes the multi-fingered gripper means 39 to move toward a substantially parallel relationship relative to each other as defined by the opposed surfaces 21, to acquire the DIP device and to lift the device toward the loaded state. It should be noted that each row of pins of the DIP device remain, at this point, slightly spread apart and have not yet been aligned for actual component insertion.

The carrier structure 25 is retracted into the chamber 7 as described above until the DIP device 41 just enters the chamber 17. The surfaces 21 of the gripper side walls are contacted by the DIP pins 63 and a friction fit therebetween is established. The width of the chamber 17 between the side wall surfaces 21 is selected to accommodate the passage of the body of the DIP device therethrough while engaging the DIP structure pins. Additionally, and more importantly, the chamber width is such that the DIP pins are urged inwardly toward the longitudinal axis of the body. In other words, both rows of pins are urged toward each other into a component insertion alignment. Thus the side wall surfaces 21 perform two important functions: the alignment of the DIP device pins and as will be explained below, the frictional retention of the DIP device within the gripper's chamber 17 during the "loaded state".

FIG. 5 illustrates the present gripper in the "loaded state" wherein both multi-fingered gripper means have been completely disengaged from the DIP device and the gripper 11 can be positioned to effect the insertion of the DIP device into the desired component receptacle. As previously indicated the surface 21 of the side wall of the body chamber 17 defines a first width which is chosen to accommodate the DIP device. The body chamber 17 has an interior width as at 69 which is greater than the aforedescribed first width. The chamber's interim, or second width, is selected to accommodate the complete disengagement of the multi-fingered gripper means from the DIP device as shown in FIG. 5. The cam-like surface 23 permits the smooth transition of the multi-fingered gripper means 39 at its radius 58 between the interior width of the chamber as at 69 and the first width as at 21. The necessary outward movement of the multi-fingered gripper means as they ride along the cam-like surface 23 is facilitated by the biasing means 51. At this point in time, the retraction of the carriage structure into the chamber is complete and the multi-fingered gripper means fully disengaged from the DIP device. A means for indicating that the carriage structure has been fully retracted into the chamber 17 can also be provided in the form of a travel limit switch means 81 which can be seen in FIG. 1. Such a travel limit switch means 81 can be mounted onto the frame 15 so that it is contacted by the cross member 35 when the carriage is fully retracted an the cross member at maximum elevation. The switch means 81 provides a "go-no go" signal to the computer control system directing the industrial manipulator-gripper system. If, for example, the DIP device was not properly acquired initially, the interruption in the gripper's operation would limit the travel of the carriage and its cross member 35, and thus fail to provide the proper "go" signal to the computer.

In FIG. 6, the gripper is engaged in the insertion of the DIP device into a DIP socket 71 which is mounted on a printed circuit board 73. In the "insertion state", the ejection means 42 comprise a pair of pneumatic cylinders which are operably associated with a pressurized air supply and appropriate control circuitry, not illustrated herein. The piston 77 of each cylinder 42 effects the controlled ejection of the DIP device from the gripper chamber 17 and insertion of the same into the socket 71 through contact with the upper surface of DIP device body, as at 79. Preferably, a pair of pneumatic cylinders, generally symmetrically disposed on the body portion 13 of the gripper 11 on either side of the carriage, provide a uniform pressure for ejecting and inserting the DIP device. Once the DIP device is inserted, the pistons 77 retract into their respective cylinders 42 and the carriage structure with its associated components extended from the chamber to effectively unsheath the multi-fingered gripper means and return the gripper 11 into a "ready state" for the acquisition of another DIP device.

What has been described is an end-effector for the automated installation of electronic components in printed circuit boards, particularly the acquisition and installation of dual-in-line package devices. However, the present end-effector can also be employed for the removal of a dual in-line package device from an IC socket or a circuit board.

I claim:

1. An end effector for acquiring a dual-in-line package device and inserting said device into a circuit board or the like comprising:

a gripper body portion having a chamber therein of a predetermined dimension;

a pair of multi-fingered gripper means operably associated with said body portion for reciprocal movement between a first, fully-extended device acquisition position and a second fully retracted position within said body portion chamber, said pair of multi-fingered gripper means also being pivotally movable from an open spaced apart relationship during acqustion and insertion of the dual in-line package device to a closed relationship for engaging and loading the dual in-line device into the body portion;

means operably associated with said multi-finger gripper means for effecting said reciprocal movement;

means operably associated with said body portion for retaining in said chamber an acquired dual in-line package device in a loaded condition for insertion after said pair of multi-fingered gripper means have moved into an open spaced apart relationship; and means operably associated with said body portion and in communication with said chamber for urging said dual in-line package device from said retaining means and inserting said device into the circuit board or the like and wherein said fingers are maintained in said second fully retracted position within said body portion chamber as said means for urging are effecting the insertion of said device.

2. The end effector according to claim 1 wherein the gripper body portion includes means for operably associating said end effector with an industrial manipulator.

3. The end effector according to claim 1 wherein the means for effecting reciprocal movement include a carriage structure on which the multi-fingered gripper means are pivotally mounted, said carriage structure being reciprocally movable, at least within the body portion chamber such that said multi-fingered gripper means are extended from and retracted into said chamber between the first and the second positions.

4. The end effector according to claim 3 wherein the means for effecting reciprocal movement includes at least one pneumatic cylinder disposed between the body portion and the carriage.

5. The end effector according to claim 3 wherein the multi-fingered gripper means which are pivotally mounted on the carriage structure, are pivotally movable from an open spaced apart relationship during acquisition and insertion of the dual in-line package device to a closed relationship for engaging and loading the dual in-line package device into the retaining means in the body portion chamber and wherein said carriage structure includes a biasing means operably associated with said multi-fingered gripper means for positively urging said multi-fingered gripper means into the open spaced apart relationship.

6. The end effector according to claim 5 wherein the gripper body portion includes two opposed side wall sections which define the longitudinal dimension of the body portion chamber, each of said side walls being so configured that said chamber has at least at first width and a second width of greater cross-sectional dimension than said first width such that as the multi-fingered gripper means is reciprocally moved between the first and second, extended and retracted positions, the first width portion of said side walls urges the multi-fingered gripper means into the closed relationship such that the dual in-line package device is engaged therewith and the second width portion is of sufficient dimension to allow the multi-fingered gripper means to open and disengage from the device.

7. The end effector according to claim 6 wherein the first dimension between the side walls is selected to accommodate between said side walls a dual in-line package device having a plurality of contact pins longitudinally disposed on either side thereof, said device being retained between said side walls by means of a friction fit between said side walls and said device's contact pins, said side walls defining, in combination, the means for retaining in said chamber an acquired dual in-line package device.

8. The end effector according to claim 7 wherein the portion of each side wall which, in combination with the other side wall, defines the portion of the chamber having a first width, is of a predetermined height selected to align the plurality of contact leads of the device when said device is loaded therebetween such that said device can be properly inserted into a circuit board or the like.

9. The end effector according to claim 7 wherein each side wall includes a cam-like transitional section between the first width and second width of the chamber defined thereby.

10. The end effector according to claim 9 wherein the multi-fingered gripper means comprise an upper portion which is pivotally associated with the carriage structure and a plurality of individual fingers extending from said upper portion, said fingers consisting of an elongated member which terminates in an inwardly disposed tooth-like appendage adapted to engage the underside of a dual in-line package device by passing between an adjacent pair of connector pins and an outer curved portion having a radius selected to facilitate the cooperation of the fingers with the cam-like transitional section.

11. The end effector according to claim 10 wherein each of the two multi-fingered gripper means has five elongated fingers, each having a tooth-like appendage at the end thereof.

12. The end effector according to claim 10 wherein each of the two multi-fingered gripper means has at least two elongated fingers, each having a tooth-like appendage at the end thereof.

13. The end effector according to claim 3 wherein the gripper body portion includes indicating means operably associated with the carriage structure for providing a signal that the multi-fingered gripper means are in the second position, retracted into the body chamber.

14. The end effector according to claim 1 wherein the means for urging the dual in-line package from the retaining means is at least a first pneumatic cylinder, said at least one cylinder being mounted on the gripper body portion such that the piston of said cylinder, upon activation thereof contacts the loaded dual in-line package, urging it from the retaining means.

15. The end effector according to claim 14 wherein the means for urging the dual in-line package device from the retaining means includes a second pneumatic cylinder, and wherein the pneumatic cylinders are disposed on said gripper relative to said dual in-line package to provide uniformly distributed force in urging said package from the retaining means and into the circuit board or the like.

16. An end effector for acquiring a dual-in-line package device and inserting said device into a circuit board or the like comprising:

a gripper body portion having a chamber therein of a predetermined dimension, said gripper body portion including two opposed side wall sections which define a longitudinal dimension of the body portion chamber, each of said side walls being so configured that said chamber has at least a first width and a second width of greater cross-sectional dimension than said first width and a cam-like transitional section defined between said first width and said second width;

a pair of multi-fingered gripper means operably associated with said body portion for reciprocal movement between a first, fully-extended device acquisition position and a second fully retracted position within said body portion chamber such that as the multi-fingered gripper means is reciprocally moved between the first and second, extended and retracted positions, the first width portion of said side walls urges the multi-fingered gripper means into the closed relationship such that the dual in-line package device is engaged therewith and the second width portion is of sufficient dimension to allow the multi-fingered gripper means to open and disengage from the device;

means operably associated with said multi-finger gripper means for effecting said reciprocal movement;

means operably associated with said body portion for retaining in said chamber an acquired dual in-line package device after the multi-fingered gripper means have disengaged therefrom and wherein the first dimension between the side walls is selected to accommodate between said side walls a dual in-line package device having a plurality of contact pins longitudinally disposed on either side thereof, said device being retained between said side walls by means of a friction fit between said side walls and said device's contact pins, said side walls defining, in combination, the means for retaining in said chamber in acquired dual in-line package device; and means operably associated with said body portion and in communication with said chamber for urging said dual in-line package device from said retaining means and inserting said device into the circuit board or the like and wherein said pair of multi-fingered gripper means are maintained in said second fully retracted position within said body portion chamber as said means for urging are effecting the insertion of said device.

17. The end effector according to claim 16 wherein the means for effecting reciprocal movement include a carriage structure on which the multi-fingered gripper means are pivotally mounted, said carriage structure being reciprocally movable, at least within the body portion chamber such that said multi-fingered gripper means are extended from and retracted into said chamber between the first and second positions and wherein the multi-fingered gripper means which are pivotally mounted on the carriage structure, are pivotaly movable from an open spaced apart relationship during acquisition and insertion of the dual in-line package device to a closed relationship for engaging and loading the dual in-line package device into the retaining means in the body portion chamber and wherein said carriage structure includes a biasing means operably associated with said multi-fingered gripper means for positively urging said multii-fingered gripper means into the open spaced apart relationship.

18. The end effector according to claim 17 wherein the portion of each side wall which, in combination with the other side wall, defines the portion of the chamber having a first width, is of a predetermined height selected to align the plurality of contact leads of the device when said device is loaded therebetween such that said device can be properly inserted into a circuit board or the like.

19. The end effector according to claim 17 wherein the multi-fingered gripper means comprise an upper portion which is pivotally associated with the carriage structure and a plurality of individual fingers extending from said upper portion, said fingers consisting of an elongated member which terminates in an inwardly disposed tooth-like appendage adapted to engage the underside of a dual in-line package device by passing between an adjacent pair of connector pins and an outer curved portion having a radius selected to facilitate the cooperation of the fingers with the cam-like transitional section.

20. The end effector according to claim 16 wherein the gripper body portion includes indicating means operably associated with the carriage structure for providing a signal that the multi-fingered gripper means are in the second position, retracted into the body chamber.

21. The end effector according to claim 16 wherein the means for urging the dual in-line package from the retaining means is at least a first pneumatic cylinder, said at least one cylinder being mounted on the gripper body portion such that the piston of said cylinder, upon activation thereof contacts the loaded dual in-line package, urging it from the retaining means.

22. The end effector according to claim 21 wherein the means for urging the dual in-line package device from the retaining means includes a second pneumatic cylinder, and wherein the pneumatic cylinders are disposed on said gripper relative to said dual in-line package to provide uniformly distributed force in urging said package from the retaining means and into the circuit board or the like.

* * * * *